United States Patent
Chee et al.

[11] Patent Number: 5,920,113
[45] Date of Patent: Jul. 6, 1999

[54] LEADFRAME STRUCTURE HAVING MOVEABLE SUB-FRAME

[75] Inventors: Hin Kooi Chee; Chee Hiong Chew; Hou Boon Tan, all of Seremban NS, Malaysia; Robert J. McLaughlin, Phoenix, Ariz.; David M. Culbertson; Alex J. Elliott, both of Tempe, Ariz.; Keng Guan Quah, Gilbert, Ariz.

[73] Assignee: Motorola, Inc., Schaumburg, Ill.

[21] Appl. No.: 08/900,658

[22] Filed: Jul. 25, 1997

[30] Foreign Application Priority Data

Aug. 13, 1996 [MY]  Malaysia ............... PI9603317

[51] Int. Cl.$^6$ ................................. H01L 23/495
[52] U.S. Cl. .................. 257/666; 257/676; 438/123; 438/111
[58] Field of Search ............... 257/666, 667, 257/670, 676; 438/123, 111, 121, 110

[56] References Cited

U.S. PATENT DOCUMENTS

| | | | |
|---|---|---|---|
| 4,809,054 | 2/1989 | Waldner | 257/670 |
| 5,343,072 | 8/1994 | Imai et al. | 257/666 |

FOREIGN PATENT DOCUMENTS 54-104787  8/1979  Japan ..................... 257/666

*Primary Examiner*—Olik Chaudhuri
*Assistant Examiner*—Nat Kelley
*Attorney, Agent, or Firm*—Rennie William Dover

[57] ABSTRACT

A leadframe (1) includes a main frame having longitudinal outer rails (4) and a number of sub-frame (8) separated from the main frame by a slit (6) extending around at least part of the perimeter of the sub-frame (8). A plurality of flag portions (2), on which a semiconductor die is to be mounted, extend from the mainframe and a plurality of lead portions (12) extend from the sub-frame (8) towards the flag portions (2). The sub-frame (8) is bent twice in a zig-zag fashion so as to be in a plane parallel to that of the main frame so that the corresponding flag and lead portions overlap without affecting the dimensions of the outer edge portion of the main frame.

10 Claims, 2 Drawing Sheets

LEADFRAME STRUCTURE HAVING MOVEABLE SUB-FRAME

FIELD OF THE INVENTION

This invention relates to a leadframe structure, and more particularly to a leadframe structure on which a semiconductor die can be mounted and which enables a package moulded around the semiconductor die to be reduced in size.

BACKGROUND OF THE INVENTION

Semiconductor devices which use high power generally require a heat sink to dissipate the generated heat. The semiconductor die is mounted on a flag portion of the leadframe, which serves as a heat sink. In order to reduce the size of the moulded package, it is desirable for a lead portion of the leadframe to extend over the die to enable short electrical connections therebetween.

Various leadframe structures are known to provide a lead portion overlapping the flag portion. In one known structure, the lead portions are simply bent out of the plane of the flag portion and then bent back again into a parallel plane over the flag portion. However, this causes the outer dimensions of the leadframe to be decreased by the distance between the two planes. If the outer dimension of the leadframe is reduced, then the automatic handling of the leadframe becomes more difficult because known leadframe handling machines operate on fixed leadframe dimensions.

Another known method of providing the lead portion overlapping the flag portion is to manufacture two separate leadframes, one having the lead portions and one having the flag portions and then connecting, for example by welding, the two leadframes together in the correct position with lead portions overlapping the flag portions. However, such manufacture is clearly more complicated, uses more material and is consequently expensive. Furthermore, it is more difficult to ensure accurate alignment of the flag and lead portions before the welding takes place.

BRIEF SUMMARY OF THE INVENTION

The present invention therefore seeks to provide a leadframe structure which overcomes, or at least reduces the above-mentioned problems of the prior art.

Accordingly, the invention provides a leadframe structure comprising a main frame having at least an outer edge portion and at least one sub-frame separated from the main frame by a slit extending around at least part of a perimeter of the sub-frame, the main frame being formed with a plurality of first tab portions, each being for connection to a respective semiconductor die, the sub-frame being formed with a plurality of second tab portions corresponding to the plurality of first tab portions, each being for connection to the corresponding semiconductor die, wherein the sub-frame can be bent out of the plane of the main frame so that the corresponding first and second tab portions can be moved closer together without affecting the dimensions of the outer edge portion of the main frame.

Preferably, the corresponding first and second die-connecting portions can be moved so that they overlap each other.

In a preferred embodiment, the first tab portions comprise flag portions for mounting the semiconductor dies and the second tab portions comprise lead portions for connection to the semiconductor dies. Preferably, at least the outer edge portion of the main frame includes one or more reference indices.

Preferably, the subframe is formed with a plurality of third tab portions corresponding to the second tab portions, each being for connection to the corresponding semiconductor die.

In one embodiment, the leadframe structure has a plurality of sub-frames, each being separated from the main frame by a slit extending around at least part of a perimeter of the respective sub-frame. The main frame preferably comprises intermediate sections extending between the plurality of sub-frames.

BRIEF DESCRIPTION OF THE DRAWINGS

Two embodiments of the invention will now be more fully described, by way of example, with reference to the drawings, of which.

DETAILED DESCRIPTION OF THE DRAWINGS

Figure 1:
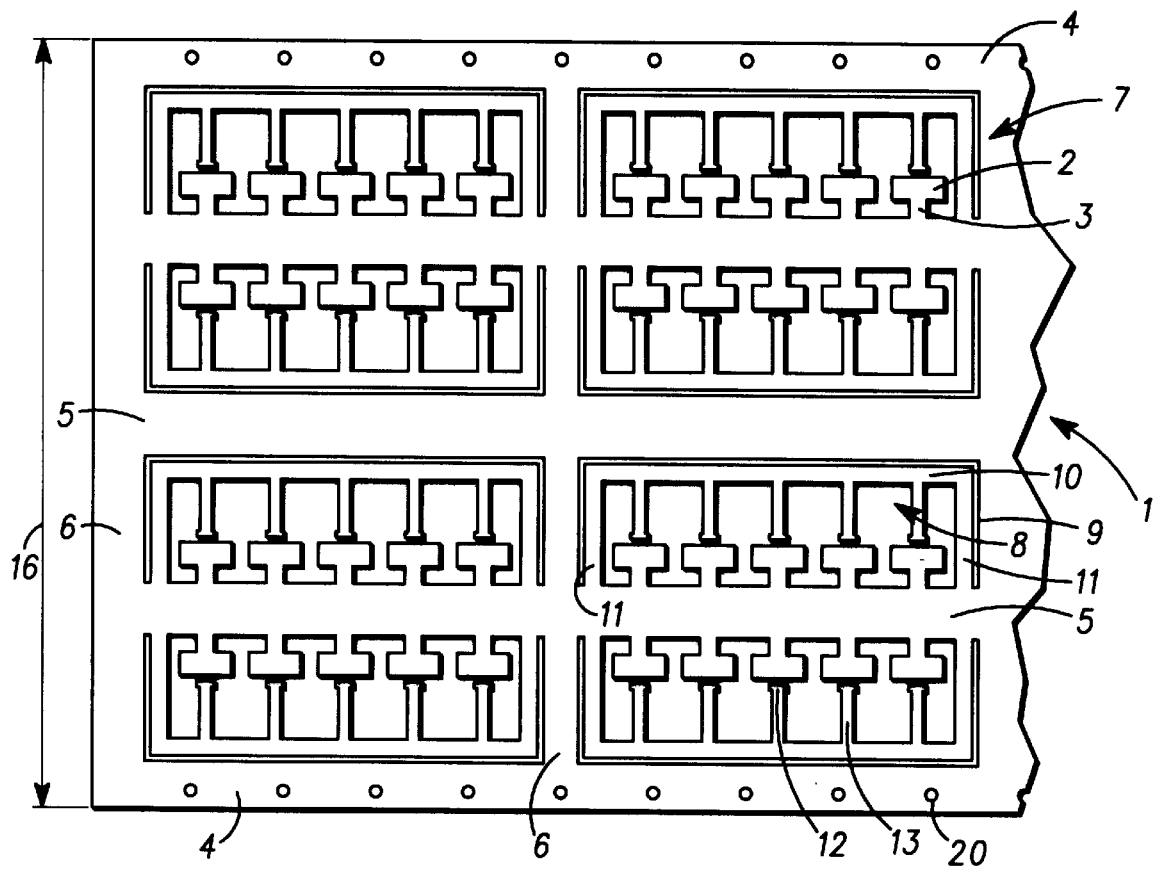
FIG. 1 is a plan view of a leadframe according to a first embodiment of the invention.

Thus, there is shown in FIG. 1 a matrix leadframe 1, which is shown, in this embodiment with four longitudinal rows of areas on which semiconductor die can be mounted and then packaged. Each row has a number of flag portions 2, each connected to the leadframe 1 by a tab portion 3, so that a number of semiconductor devices can be mounted and packaged on a single leadframe and then separated, or singulated, therefrom. The leadframe 1 is generally stamped, or otherwise formed from sheet metal, such as copper, and has longitudinal outer rails 4 providing outer edges of the leadframe 1, longitudinal inner rails 5 extending between the rows and transverse rails 6 extending between the longitudinal rails 4 and 5 thereby dividing the leadframe 1 into a number of sections, 7. It will be apparent that the number of longitudinal inner rails 5 will depend on the number of rows, and the number of transverse rails will depend on the length of the leadframe 1. Indexing holes 20 are formed in the longitudinal outer rails 4 to be used as guiding and indexing features during the assembly process. The width of the leadframe 1 is indicated by arrows 16.

Each section 7 includes a subframe 8 separated from the inner or outer longitudinal rails 4 and 5 and the transverse rails 6 by a slot 9 extending along three sides of the subframe 8. Each subframe 8 includes a main rail 10 and connecting rails 11, which connect the subframe 8 to the leadframe 1. The leadframe material in the slot 9 is removed by stamping or other metal cutting process to create a gap between the main leadframe 1 and the subframe 8.

Each section 7 of the leadframe 1 is provided with a number of flag portions 2, which will act as heatsinks, onto each of which a semiconductor die will be mounted. In the example illustrated in FIG. 1, the number of flag portions 2 per section is five, although it will be apparent that other numbers could be chosen. Each flag portion 2 is connected to one of the longitudinal rails 4 or 5 of leadframe 1 by the tab portion 3. Similarly, each subframe 8 is provided with a number (the same number as the number of flag portions 2) of lead portions 12, each of which will be connected to the semiconductor die devices after those devices are mounted on the respective flag portions 2. The lead portions 12 are attached to the subframe main rail 10 by tab portions 13.

Figure 2:
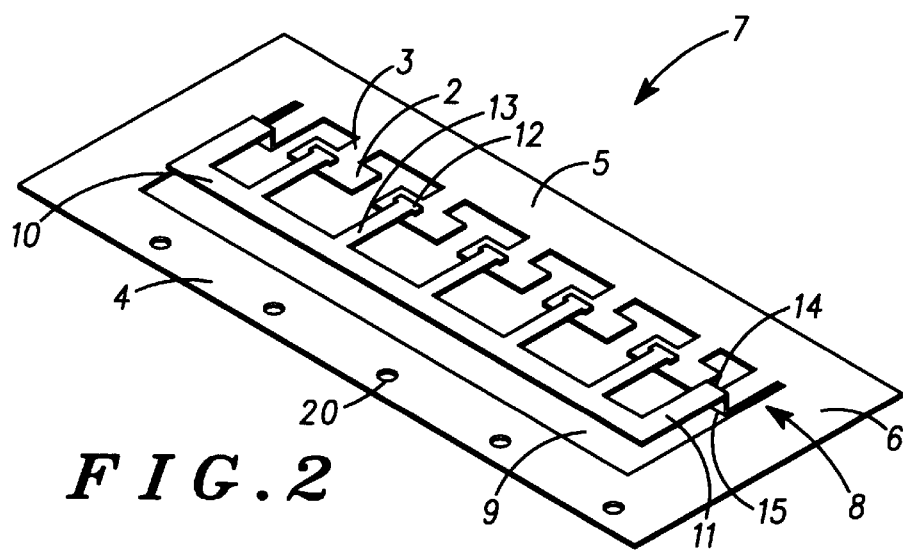
FIG. 2 is an enlarged isometric view of a portion of the leadframe of FIG. 1 after a forming process.

FIG. 2 shows an enlarged view of one section 7 of the leadframe 1. Although for clarity, in this drawing, the section 7 only has three flag portions 2 and lead portions 12, the elements which are identical to those described above with reference to FIG. 1 have the same reference numerals. The lead portions 12 each extend towards a corresponding one of the flag portions 2 so that, when a semiconductor die is mounted on a flag portion 2 the corresponding lead portion 12 will be adjacent thereto so as to facilitate electrical connection between the lead portion 12 and the die (not shown).

In order to reduce the distance between the lead portion 12 and the electrical die mounted on the flag portion 2, the connecting rails 11 of the subframe 8 are formed so as to have two opposite bends 14 and 15 in a zig-zag fashion, so that the lead portions 12 overlap with the corresponding flag portions 2. The distance of the overlap is controlled by controlling the distance between the two bends 14 and 15.

Figure 3:
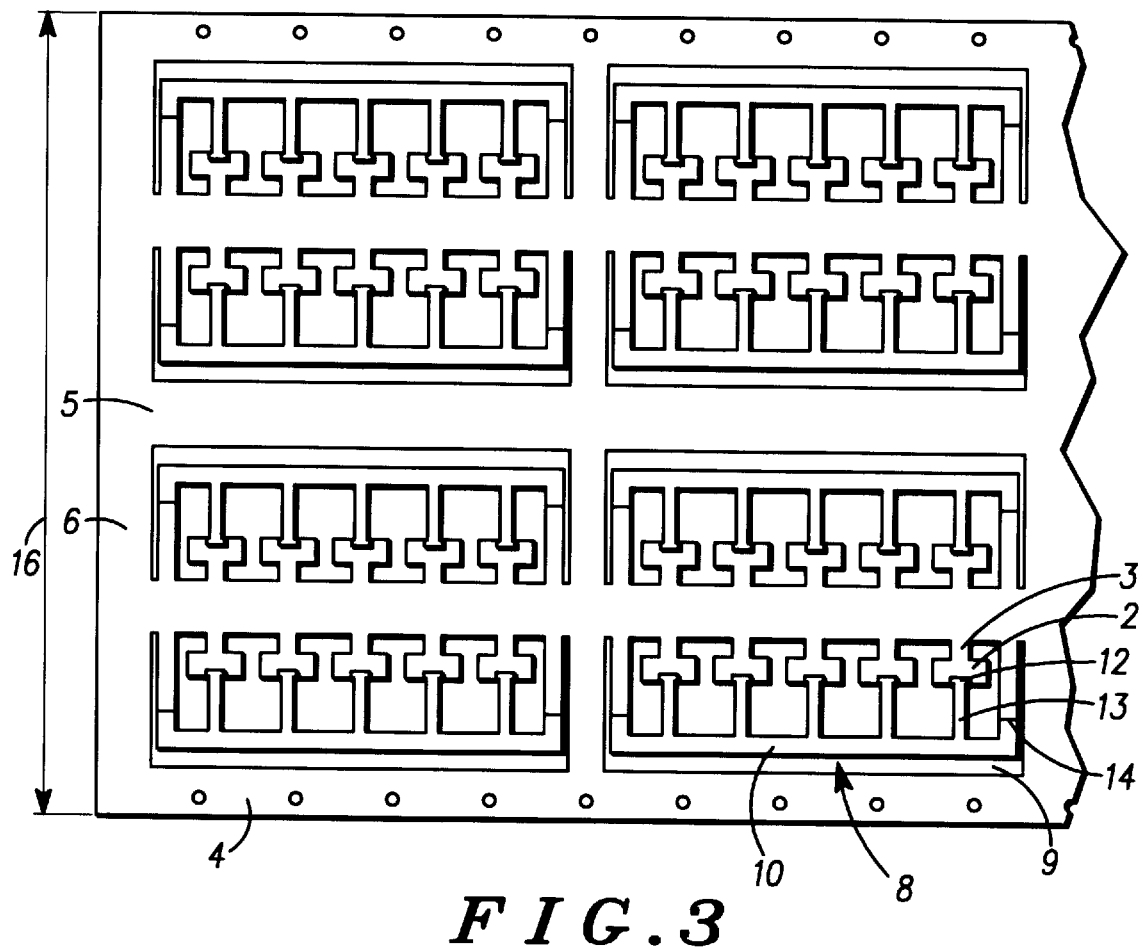
FIG. 3 is a plan view of the leadframe of FIG. 1 after the forming process.

Turning now to FIG. 3, there is shown the same leadframe 1 as in FIG. 1, but after the formation of the bends 14 and 15. It will be seen that, although the width of the slot 9 between the subframe main rail 10 and the adjacent longitudinal rail 4 or 5 has increased by the distance the subframe 8 has been moved to overlap with the flag portions 2, the width of the leadframe 1, indicated by arrows 16 has remained unchanged. Therefore, handling of the leadframe will not require adjustment according to the amount of overlap, since its outer dimensions remain the same.

It will be apparent that the subframes could be bent and/or formed in other ways and in other shapes. However, all bending and forming processes which could alter the overall dimensions or geometry of the leadframe are done only on the subframes and not on the main leadframe.

Figure 4:
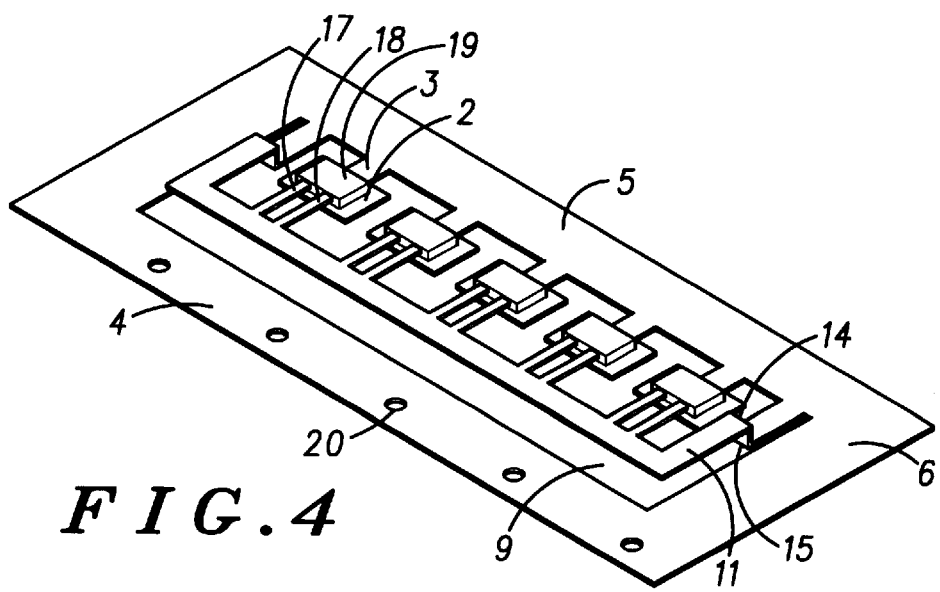
FIG. 4 is an isometric view of a leadframe in accordance with a second embodiment of the invention.

FIG. 4 shows another embodiment of a leadframe according to the invention. In this figure all elements which are identical to those of the previous figures have the same reference numerals. In this embodiment, instead of a single lead portion 12 corresponding to each flag portion 2, as in the first embodiment, each flag portion 2 has two lead portions 17 and 18 associated therewith and attached to the subframe main rail 10. Again, the subframe 8 is bent twice so as to be in a plane parallel to that of the flag portions and the rest of the leadframe so that the two lead portions 17 and 18 overlap the flag portion 2. The semiconductor die 19 is mounted on the flag portion 2, which is attached to the main leadframe 1 by a tab portion 3, which may or may not be electrically functional in the final product. The lead portions 17 and 18 are then electrically connected to the semiconductor die 19. The semiconductor package is then made in the known way by clamping two mould pieces around the leadframe so as to enclose the mounted semiconductor die, together with its electrical connections, in a mould cavity, into which a mould compound is inserted and then cured to form the package. If the flag portion of the leadframe is to be used as a heatsink, then the package is moulded with the heatsink at its periphery.

It will be appreciated that, although the forming process of the lead portions can alter the dimension and geometry of the inner subframe, the critical outer dimensions of the leadframe will stay constant throughout the forming/bending process. Thus, there is provided an accurate indexing and reference point for assembly processes (e.g. die/clip/wire bond, mold and trim/form, etc.). This allows for a common leadframe platform of which no outer dimensions need to be changed when different sizes of packages are introduced. Indexing holes and sensor/indicator/fiducial marks can be stamped on the outer rails of the leadframe. The leadframe is designed in such a way that all guiding and feeding operations take place at the outer rails of the leadframe and will not deform the inner subframes.

It will be appreciated that although only two particular embodiments of the invention have been described in detail, various modifications and improvements can be made by a person skilled in the art without departing from the scope of the present invention. For example, although the lead portions are described above as overlapping the flag portions, it will be apparent that they need not do so. The lead portions could simply be moved nearer the flag portions without actually overlapping with them.

We claim:

1. A leadframe structure comprising a main frame having at least an outer edge portion and a plurality of such-frames, each sub-frame being separated from the main frame by a slit extending around at least part of the perimeter of the sub-frame, the main frame being formed with a plurality of first die-connecting portions for connection to a corresponding plurality of semiconductor die, each sub-frame being formed with a plurality of second die-connecting portions corresponding to the plurality of first die-connecting portions for connection to the corresponding plurality of semiconductor die, wherein each sub-frame can be bent out of the plane of the main frame so that the corresponding first and second die-connecting portions can be moved closer together without affecting the dimensions of the outer edge portion of the main frame.

2. A leadframe structure according to claim 1, wherein the corresponding first and second die-connecting portions can be moved so that they overlap each other.

3. A leadframe structure according to claim 1, wherein the first die-connecting portions comprise flag portions for mounting the semiconductor dies and the second die-connecting portions comprise lead portions for connection to the semiconductor dies.

4. A leadframe structure comprising a main frame having at least an outer edge portion and a plurality of sub-frames, each sub-frames being separated from the main frame by a slit extending around at least part of the perimeter of the sub-frame, the main frame being formed with a plurality of first die-connecting portions for connection to a corresponding plurality of semiconductor die, each sub-frame being formed with a plurality of second die-connecting portions and a plurality of third die-connecting portions corresponding to the second die-connecting portions, each being for connection to the corresponding semiconductor die, wherein the such-frame can bent out of the plane of the main frame so that the corresponding first and second die-connecting portions can be moved closer together without affecting the dimensions of the outer edge portion of the main frame.

5. A leadframe structure according to claim 1, wherein the main frame comprises intermediate sections extending between the plurality of sub-frames.

6. A leadframe structure according to claim 1, wherein at least the outer edge portion of the main frame includes one or more reference indices.

7. A leadframe according to claim 2, wherein the first die-connecting portions comprise flag portions for mounting the semiconductor dies and the second die-connecting portions comprise lead portions for connection to the semiconductor dies.

8. A leadframe according to claim 2, wherein each sub-frame is formed with a plurality of third die-connecting portions corresponding to the second die-connecting portions, each third die-connecting portion being for connection to the corresponding semiconductor die.

9. A method of packaging a semiconductor die, the method comprising the steps of:

providing a leadframe comprising a main frame having at least an outer edge portion and a plurality of sub-frames, each sub-frame being separated from the main frame by a slit extending around at least part of the perimeter of the sub-frame and being connected to the main frame by at least one bridge portion, the main frame being formed with a plurality of second die-connecting portions corresponding to the plurality of first die-connecting portions;

bending each sub-frame at its corresponding bridge portion using at least two bends of opposite directions such that the second-die connecting portions are brought closer to the corresponding first die-connecting portions;

mounting a plurality of semiconductor die on corresponding ones of the plurality of first die-connecting portions;

making electrical connections between corresponding semiconductor die and the second die-connecting portions; and molding a mold compound around each semiconductor die, together with at least part of the corresponding first and second die-connecting portions to form a plurality of semiconductor packages.

10. A method of packaging a semiconductor die according to claim 9, wherein each subframe is formed with a plurality of third die-connecting portions corresponding to the second die-connecting portions, and the step of making electrical connections includes making electrical connections between each third die-connecting portion and the corresponding semiconductor die.

* * * * *

UNITED STATES PATENT AND TRADEMARK OFFICE
CERTIFICATE OF CORRECTION

PATENT NO. : 5,920,113  
DATED : July 6, 1999  
INVENTOR(S) : Hin Kooi Chee, Chee Hiong Chew and Hou Boon Tan It is certified that error appears in the above-identified patent and that said Letters Patent is hereby corrected as shown below:

<u>Column 4,</u>  
Line 21, delete "such" and replace with -- sub --.  
Line 47, delete "frames" and replace with -- frame --.  
Line 57, delete "the such-frame can bent out of the plane of the main frame" and replace with -- the sub-frame can be bent out of the plane of the main frame --.

Signed and Sealed this

Thirtieth Day of April, 2002

Attest:

JAMES E. ROGAN  
Attesting Officer     Director of the United States Patent and Trademark Office